(12) United States Patent
Kim

(10) Patent No.: US 7,042,781 B2
(45) Date of Patent: May 9, 2006

(54) SEMICONDUCTOR MEMORY DEVICE FOR REDUCING WRITE RECOVERY TIME

(75) Inventor: Sam-Soo Kim, Kyoungki-do (KR)

(73) Assignee: Hynix Semiconductor Inc., (KR)

( * ) Notice: Subject to any disclaimer, the term of this patent is extended or adjusted under 35 U.S.C. 154(b) by 39 days.

(21) Appl. No.: 10/977,156

(22) Filed: Oct. 29, 2004

(65) Prior Publication Data

US 2005/0135172 A1 Jun. 23, 2005

(30) Foreign Application Priority Data

Oct. 31, 2003 (KR) .................. 10-2003-0076852

(51) Int. Cl.
*G11C 7/00* (2006.01)
*G11C 7/10* (2006.01)
*G11C 5/14* (2006.01)
*G06F 1/04* (2006.01)

(52) U.S. Cl. .............. 365/205; 365/189.05; 365/227; 365/203; 365/196; 327/296

(58) Field of Classification Search .......... 365/205, 365/189.05, 227, 203, 196; 327/296
See application file for complete search history.

(56) References Cited

U.S. PATENT DOCUMENTS

| 5,859,807 | A | 1/1999 | Otori et al. |
| 5,881,005 | A | 3/1999 | Otori et al. |
| 6,166,977 | A | 12/2000 | Saitoh et al. |
| 6,347,058 | B1 | 2/2002 | Houghton et al. |
| 6,480,425 | B1 * | 11/2002 | Yanagisawa et al. .. 365/189.05 |
| 6,566,929 | B1 * | 5/2003 | Pyo .......................... 327/296 |
| 6,778,460 | B1 * | 8/2004 | Jung ......................... 365/227 |
| 2004/0233754 | A1 | 11/2004 | Kwon |

FOREIGN PATENT DOCUMENTS

| JP | 10-275473 | 10/1998 |
| JP | 11-265571 | 9/1999 |
| JP | 2001-035164 | 2/2001 |

\* cited by examiner

*Primary Examiner*—Amir Zarabian
*Assistant Examiner*—Anthan Tran
(74) *Attorney, Agent, or Firm*—Blakely Sokoloff Taylor & Zafman

(57) ABSTRACT

A semiconductor memory device for reducing a data recovery time includes a cell block having a plurality of unit cells, each for storing a data; a command control block for receiving an activation control signal and a precharge command signal to thereby generate first and second control signals; an overdriving control block for generating a control pulse in response to the first control signal; a power supplier for selectively supplying one of a core voltage and a high voltage in response to the control pulse; and a sense amplifying block, which is enabled by the second control signal, for sensing and amplifying the data stored in the cell block by using one of the core voltage and the high voltage outputted from the power supplier, wherein an activation period of the second control signal is longer than that of the first control signal.

7 Claims, 8 Drawing Sheets

SEMICONDUCTOR MEMORY DEVICE FOR REDUCING WRITE RECOVERY TIME

FIELD OF INVENTION

The present invention relates to a semiconductor memory device; and, more particularly, to the semiconductor memory device capable of reducing a write recovery time.

DESCRIPTION OF PRIOR ART

Recently, it is rapidly developed an apparatus and a method for carrying out an operation of a semiconductor memory device in higher speed. As the semiconductor memory device operates in high speed, the semiconductor memory device should observe a lot of items in its specification. Among a lot of items in its specification, a write recovery time tWR, i.e., data-in to precharge command time tDPL, is representative.

The write recovery time tWR means a period from a first timing for storing a data to a second timing for performing a precharge operation. Namely, the write recovery time tWR is considered as a minimum period for storing a data in response to an instruction without a disturbance of a precharge command.

For instance, in a synchronous semiconductor memory device, it is assumed that a burst length is 2. Herein, the burst length is the number of data continuously outputted by one time data access operation, e.g., a data write operation in response to one write instruction. In the data write operation, the write recovery time tWR means duration from a first clock rising edge of inputting a second data, i.e., a data stored in a unit cell directly after a first data is stored therein, to a second clock rising edge of inputting a precharge command.

Typically, in a semiconductor memory device development, there are various methods for adjusting the write recovery time tWR. A first one is a synchronous method for performing an auto-precharge operation at a predetermined timing, i.e., a timing, which is synchronized with the clock signal, after predetermined clock periods based on duration of burst length since the data write operation, e.g., a write instruction, is carried out. A second one is an asynchronous method for performing an auto-precharge operation at a predetermined timing, i.e., timing after a predetermined period based on duration of burst length since the data write operation, e.g., a write instruction, is carried out. Also, a third one is a complex method which is a kind of the first and second methods combined.

According to a plurality of operation conditions, inclusive of a frequency, a voltage, a temperature and the like, and a manufacturing process and a usage of the semiconductor memory device, one of above described methods is properly selected. For example, if manufacturing steps and conditions are changed in the bud, it is proper that the first method, i.e., the synchronous method, is used. Also, if a bandwidth of an operation frequency is wide, the asynchronous method is proper.

FIG. 1 is a block diagram describing partial blocks of a conventional semiconductor memory device related to a data write operation.

As shown, the conventional semiconductor memory device includes a command control block 10, an overdriving control block 20, a power supplier 30, a sense amplifying block 40 and a cell block 50.

The command control block 10 receives a precharge command PCG and an activation control signal ACT and outputs a sense amplifying enable signal SAEN to the overdriving control block 20 and the sense amplifying block 40. The overdriving control block 20 is for controlling the power supplier 30 in order to performing an overdriving operation. A control pulse SPB outputted from the overdriving control block 20 is inputted to the power supplier 30. The power supplier 30 generates a core voltage Vcore or a high voltage VPP in response to the control pulse SPB.

The sense amplifying block 40 includes a sense amplifier control block 41, a sense amplifier driving block 42 and a sense amplifier block 43. The sense amplifier control block 41 receives the sense amplifying enable signal SAEN and outputs an operation voltage control signal RTO and a ground supply signal SZ to the sense amplifier driving block 42. Then, in response to the operation voltage control signal RTO and the ground supply signal SZ, the sense amplifier driving block 42 outputs the core voltage Vcore and the ground VSS as an operation voltage rto and a ground level voltage sz into the sense amplifier block 43. The sense amplifier block 43 is for sensing and amplifying a data outputted from the cell block 50 by using the operation voltage rto and the ground level voltage sz.

FIG. 2 is a circuit diagram showing a sense amplifier driving block 41 shown in FIG. 1.

As shown, the sense amplifier driving block 41 includes a first PMOS transistor MP1, a first NMOS transistor MN1 and a second NMOS transistor MN2.

Herein, the first PMOS transistor MP1 is coupled to the power supplier 30. That is, the first PMOS transistor MP1 is for transmitting one of the core voltage Vcore and the high voltage VPP outputted from the power supplier 30 as the operation voltage rto in response to the operation voltage control signal RTO. Herein, the high voltage VPP is used during an overdriving operation. Likewise, the second NMOS transistor MN2 coupled to the ground VSS is for transmitting the ground VSS as the ground level voltage sz in response to the ground supply signal SZ. Lastly, the first NMOS transistor MN1 receives a bit line equalization signal bleq and equalizes a voltage level of the operation voltage rto to a voltage level of the ground level voltage sz in response to the bit line equalization signal.

FIG. 3 is a circuit diagram describing a partial circuit of a sense amplifier block 43 shown in FIG. 1.

As shown, the sense amplifier block 43 includes a sense amplifier constituted with four MOS transistors MP2, MP3, MN3 and MN4. The sense amplifier senses a voltage level supplied to a bit line pair BL and /BL and amplifies the sensed voltage level by using the operation voltage rto and the ground level voltage sz. Generally, for amplifying the sense voltage level, the core voltage Vcore is inputted as the operation voltage rto and the ground VSS is inputted as the ground level voltage sz.

FIG. 4 is a waveform demonstrating an operation of the conventional semiconductor memory device shown in FIG. 1. Hereinafter, referring to FIGS. 1 to 4, an operation of the conventional semiconductor memory device is described in detail.

First of all, the command control block 10 receives the activation control signal ACT; and, then, activates the sense amplifying enable signal SAEN and outputs the activated amplifying enable signal to the overdriving control block 20 and the sense amplifying block 40. Herein, the sense amplifying enable signal SAEN is inactivated in response to the precharge command PCG.

The sense amplifier control block 41 included in the sense amplifying block 40 is enabled by the sense amplifying enable signal SAEN. Then, the sense amplifier control block 41 generates the operation voltage control signal RTO being a logic low level and the ground supply signal SZ being a logic high level.

In response to the operation voltage control signal RTO being a logic low level and the ground supply signal SZ being a logic high level, the first PMOS transistor MP1 and the second NMOS transistor MN2 of the sense amplifier driving block 42 are turned on. Thus, the core voltage Vcore is outputted as the operation voltage rto to the sense amplifier driving block 42; and the ground VSS is outputted as the ground level voltage sz to the sense amplifier driving block 42. Then, a data supplied to the bit line pair BL and /BL can be sensed and amplified by the sense amplifier block 43.

The bit line equalization signal bleq, which is inputted to the sense amplifier driving block 42, is activated during a precharge operation. If the bit line equalization signal bleq is activated, the operation voltage sto is shorted out with the ground level voltage sz. That is, voltage levels of the operation voltage sto and the ground level voltage sz are the same as a half level of the core voltage, i.e., ½Vcore.

Meanwhile, as a performance of a semiconductor memory device is rapidly developed, a sense amplifier included in the semiconductor memory device should be operated faster. However, because a load of a bit line pair is increased and a voltage level of a supply voltage is decreased, an operation speed of the sense amplifier becomes slower. For solving this advantage, a voltage level of an operation voltage, e.g., rto, is increased when a data supplied to the bit line pair is amplified by the sense amplifier. This method is generally called as an overdriving operation.

The overdriving operation of the semiconductor memory device is controlled by the overdriving control block 20 shown in FIG. 1. If the sense amplifying enable signal SAEN is activated, the overdriving control block 20 generates the control pulse SPB and outputs the control pulse SPB to the power supplier 30. Referring to FIG. 4, the control pulse SPB is activated as a logic low level. That is, if the control pulse SPB being a logic high level is inputted to the power supplier 30, the power supplier 30 outputs the core voltage Vcore to the sense amplifier driving block 42 included in the sense amplifying block 40.

Otherwise, the power supplier 30 outputs the high voltage VPP to the sense amplifier driving block 42. Then, when the control pulse SPB is activated, i.e., Td1, the high voltage VPP is inputted as the operation voltage rto; and, as a result, an operation speed of the sense amplifier block 43 becomes fast. Namely, the sense amplifying block 40 including the sense amplifier block 43 is operated by the overdriving operation.

In the other hand, as a performance of the semiconductor memory device is developed, a write recovery time tWR is one of critical points for increasing the operation speed of the semiconductor memory device. The write recovery time tWR means a period until a precharge operation is carried out after a data is inputted and stored in response to a write command.

In detail, if the write command is inputted to the semiconductor memory device, a data stored in a unit cell corresponding with the write command and an inputted address is sensed and amplified. Then, the data is latched in the sense amplifier. At this time, the data latched in the sense amplifier is eliminated and an inputted data from an external circuit is latched in the sense amplifier if an inputted data corresponded with the write command is not matched with the data latched in the sense amplifier. A time for performing above operation is the write recovery time tWR.

Generally, for reducing the write recovery time tWR, a voltage level of the operation voltage used for the sense amplifier is increased. Thus, if the high voltage VPP which has a higher voltage level than does the core voltage Vcore can be inputted to the sense amplifier as the operation voltage rto, the operation speed of the sense amplifier becomes faster; and, then, the write recovery time tWR is also reduced. As a result, an operation speed of the semiconductor memory device is improved.

However, in above case, a voltage level of a supply voltage should be boosted up for generating the high voltage VPP during the overdriving operation. Also, because the sense amplifier is operated in response to a higher operation voltage, a stress of each unit cell is occurred.

In addition, if an operation voltage becomes higher, a current consumption is more increased. Then, it is difficult to develop a semiconductor memory device stably operated under a low level operation voltage or a low level supply voltage.

SUMMARY OF INVENTION

It is, therefore, an object of the present invention to provide a semiconductor memory device for performing an operation in a fast speed by reducing a write recovery time without a high voltage during a precharge operation.

In accordance with an aspect of the present invention, there is provided a semiconductor memory device for reducing a data recovery time including a cell block having a plurality of unit cells, each for storing a data; a command control block for receiving an activation control signal and a precharge command signal to thereby generate first and second control signals; an overdriving control block for generating a control pulse in response to the first control signal; a power supplier for selectively supplying one of a core voltage and a high voltage in response to the control pulse; and a sense amplifying block, which is enabled by the second control signal, for sensing and amplifying the data stored in the cell block by using one of the core voltage and the high voltage outputted from the power supplier, wherein an activation period of the second control signal is longer than that of the first control signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for performing an operation in a fast speed by reducing a write recovery time without a high voltage during a precharge operation according to the present invention will be described in detail referring to the accompanying drawings.

Figure 5:
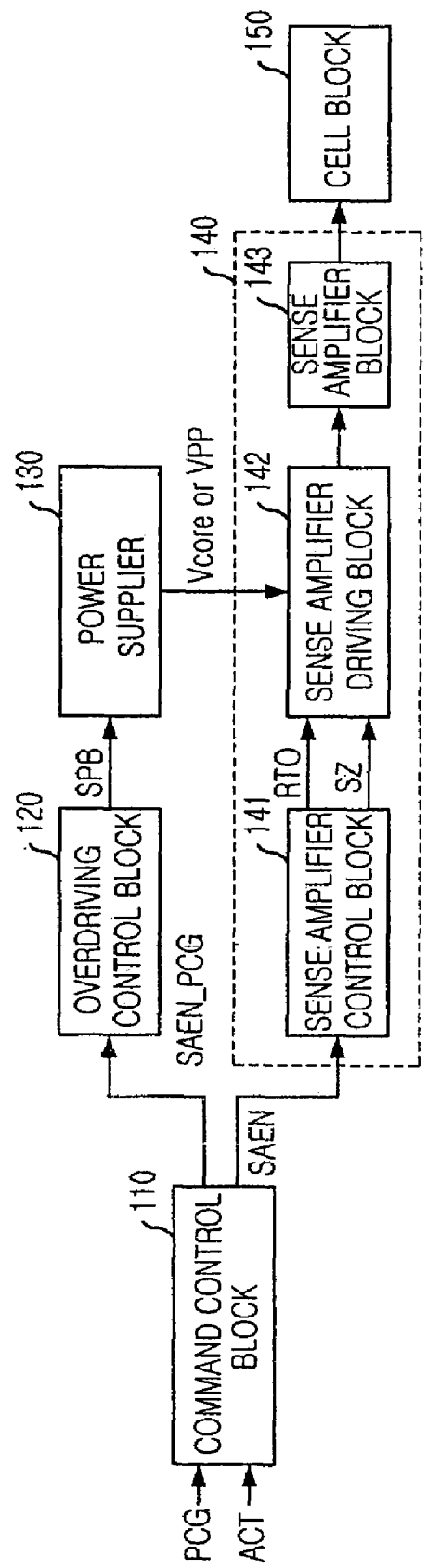
FIG. 5 is a block diagram describing partial blocks of a semiconductor memory device related to a data write operation in accordance with the present invention.

FIG. 5 is a block diagram describing partial blocks of a semiconductor memory device related to a data write operation in accordance with the present invention.

As shown, the semiconductor memory device includes a command control block 110, an overdriving control block 120, a power supplier 130, a sense amplifying block 140 and a cell block 150.

The command control block 110 receives a precharge command PCG and an activation control signal ACT and outputs a first control signal SAEN_PCG and a second control signal SAEN to the overdriving control block 120 and the sense amplifying block 140 respectively. The overdriving control block 120 controls the power supplier 130 in response to the first control signal SAEN_PCG for carrying out an overdriving operation. A control pulse SPB outputted from the overdriving control block 120 is inputted to the power supplier 130. The power supplier 130 generates a core voltage Vcore or a high voltage VPP in response to the control pulse SPB. Herein, the high voltage VPP has a higher voltage level than the core voltage Vcore does.

The sense amplifying block 140 includes a sense amplifier control block 141, a sense amplifier driving block 142 and a sense amplifier block 143. The sense amplifier control block 141 receives the second control signal SAEN and outputs an operation voltage control signal RTO and a ground supply signal SZ to the sense amplifier driving block 142. Then, in response to the operation voltage control signal RTO and the ground supply signal SZ, the sense amplifier driving block 142 outputs the core voltage Vcore and the ground VSS as an operation voltage and a ground level voltage into the sense amplifier block 143. The sense amplifier block 143 is for sensing and amplifying a data outputted from the cell block 150 by using the operation voltage and the ground level voltage.

Herein, the command control block 110 outputs the first control signal SAEN_PCG to the overdriving control block 120 for controlling an overdriving operation. The second control signal SAEN has a longer activation period than the first control signal SAEN_PCG does. In addition, because the sense amplifying block 140 is similar to the sense amplifying block 40 in their structure, a detailed description about the sense amplifying block 140 is omitted herein.

Figure 6:
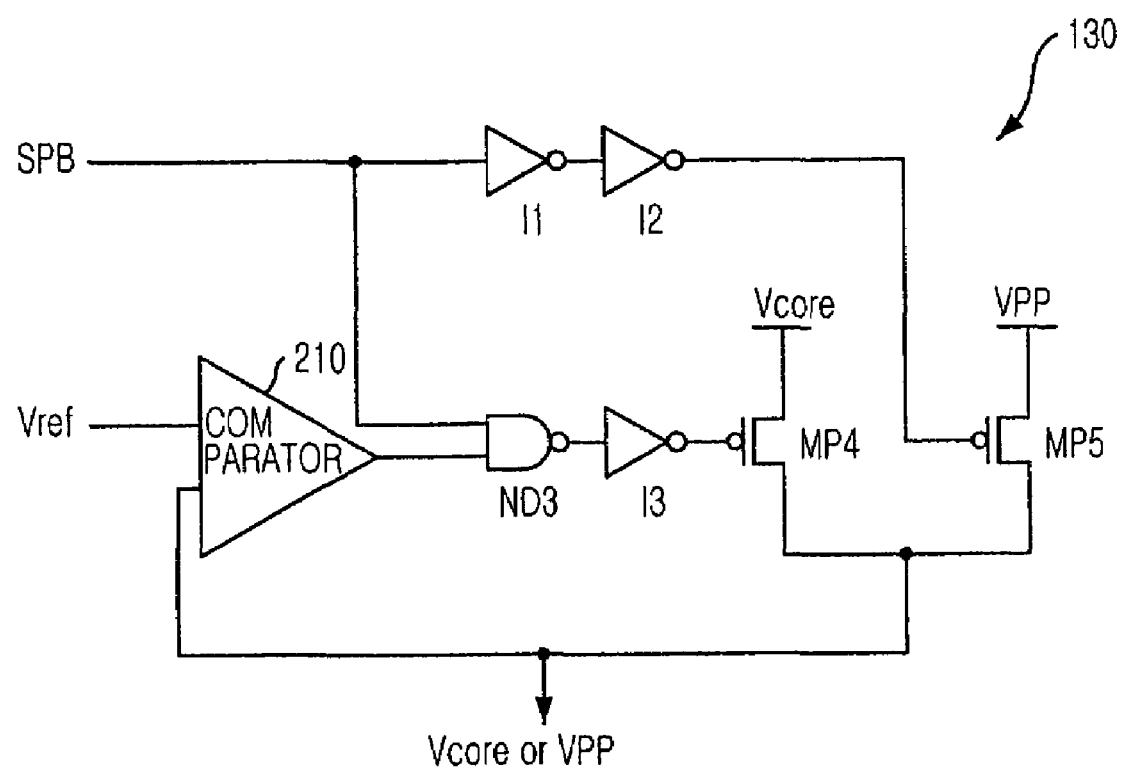
FIG. 6 is a circuit diagram showing a power supplier shown in FIG. 5.

FIG. 6 is a circuit diagram showing the power supplier 130 shown in FIG. 5.

As shown, the power supplier 130 includes a comparator 210, first to third inverters I1 to I3, a first NAND gate ND3 and first and second MOS transistors MP5 and MP4.

In detail, the first inverter I1 inverts the control pulse SPB outputted from the overdriving control block 120. The second inverter I2 is for inverting an output signal of the first inverter I1. Then, the first MOS transistor MP5 coupled to the high voltage VPP outputs the high voltage VPP in response to an output signal of the second inverter I2.

The comparator 210 receives a reference voltage Vref and one of the core voltage Vcore and the high voltage VPP respectively outputted from the first and second MOS transistors MP5 and MP4. The comparator 210 compares the reference voltage Vref with one of the core voltage Vcore and the high voltage VPP; and, then, outputs a comparison result to the first NAND gate ND3.

The first NAND gate ND3 is for receiving the comparison result outputted from the comparator and the control pulse SPB and outputting a result of a logic NAND operation to the third inverters I3. The third inverter I3 inverts the result outputted from the first NAND gate ND3. Then, the second MOS transistor MP4 coupled to the core voltage Vcore outputs the core voltage Vcore in response to an output signal of the third inverter I3.

Figure 7:
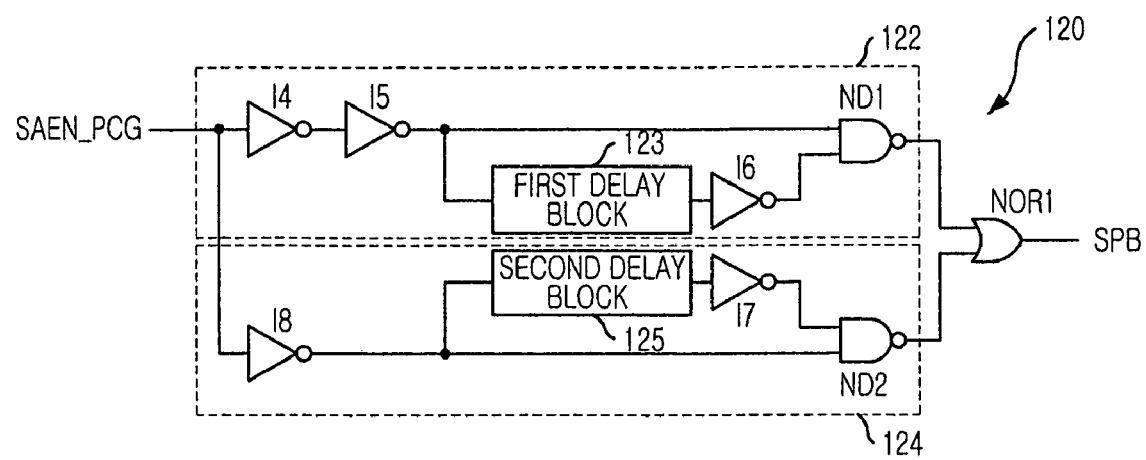
FIG. 7 is a circuit diagram showing an overdriving control block shown in FIG. 5.

FIG. 7 is a circuit diagram showing the overdriving control block 120 shown in FIG. 5.

As shown, the overdriving control block 120 includes a first pulse generator 122, a second pulse generator 124 and a first NOR gate NOR1. The first pulse generator 122 is for receiving the first control signal to generate a first pulse signal; and the second pulse generator 124 is for receiving the first control signal to generate a second pulse signal. The first NOR gate NOR1 receives the first and second pulse signals outputted from the first and second pulse generators 122 and 124 and outputs a result of a logic NOR operation as the control pulse SPB.

In detail, the first pulse generator includes fourth to sixth inverter I4 to I6, a first delay block 123 and a second NAND gate ND1. The fourth inverter I4 inverts the first control signal SAEN_PCG outputted from the command control block 110. The fifth inverter I5 is for inverting an output signal of the fourth inverter I4. Then, the first delay block 123 delays an output signal of the fifth inverter I5 by a predetermined time. The sixth inverter I6 inverts an output signal of the first delay block 123 and outputs to the second NAND gate ND1. The second NAND gate ND1 receives the output signal of the fifth inverter I5 and an output signal of the sixth inverter I6 and outputs a result of a logic NAND operation as the first pulse signal to the first NOR gate NOR1.

Likewise, the second pulse generator 124 includes seventh and eighth inverters I7 and I8, a second delay block 125 and a third NAND gate ND2. The eighth inverter I8 inverts the first control signal SAEN_PCG outputted from the command control block 110. The second delay block 125 delays an output signal of the eighth inverter I8 by a predetermined time. The seventh inverter I7 is for an output signal of the second delay block 125. Then, the third NAND gate ND2 receives the output signal of the eighth inverter I8 and an output signal of the seventh inverter I7 and outputting a result of a logic NAND operation as the second pulse signal to the first NOR gate NOR1.

Figure 8:
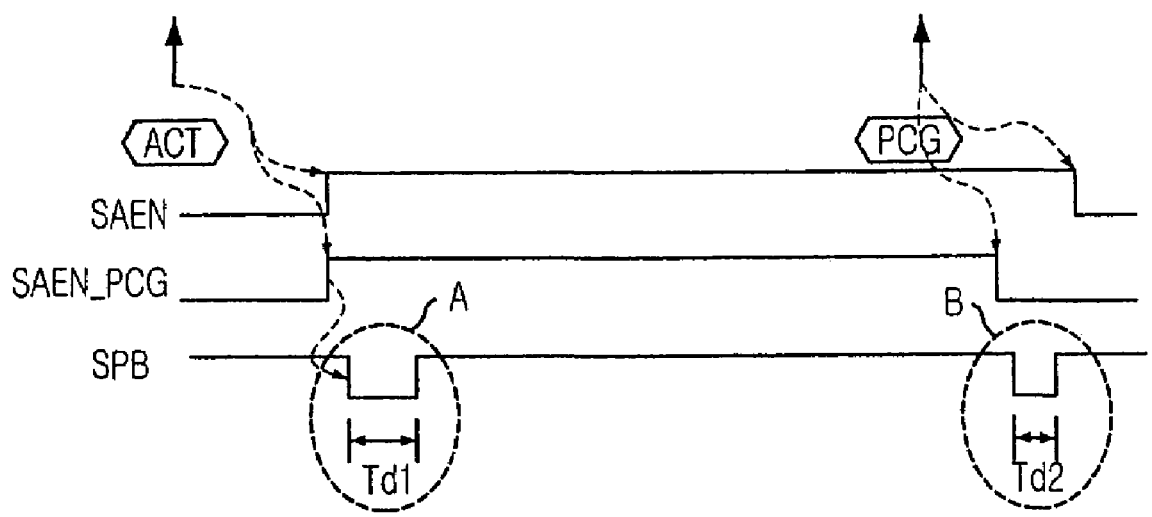
FIG. 8 is a waveform demonstrating an operation of the semiconductor memory device shown in FIG. 5.

FIG. 8 is a waveform demonstrating an operation of the semiconductor memory device shown in FIG. 5. Hereinafter, referring to FIGS. 5 to 8, an operation of the semiconductor memory device according to the present invention is described in detail.

First of all, the command control block 110 receives the activation control signal ACT and the precharge command signal PCG; and, then, activates the first control signal SAEN_PCG and the second control signal SAEN. Herein, the first control signal SAEN_PCG is for controlling the overdriving operation of the semiconductor memory device in order to reduce the write recovery time. The second control signal SAEN enables the sense amplifying block 140 for sensing and amplifying the data stored in the cell block 150.

Further, the first and second control signals SAEN_PCG and SAEN are inactivated in response to the precharge command PCG. However, referring to FIG. 8, the second control signal SAEN is later inactivated than be the first control signal SAEN_PCG. That is, the first control signal SAEN_PCG is inactivated at the timing of performing an operation in response to the precharge command signal PCG; and the second control signal SAEN is inactivated after a predetermined time.

The sense amplifier control block 141 included in the sense amplifying block 140 is enabled by the first control signal SAEN. Then, the sense amplifier control block 141 generates the operation voltage control signal RTO and the ground supply signal SZ.

In response to the operation voltage control signal RTO and the ground supply signal SZ, the core voltage Vcore is outputted as the operation voltage to the sense amplifier driving block 142; and the ground VSS is outputted as the ground level voltage to the sense amplifier driving block 142. Then, a data stored in the cell block 150 can be sensed and amplified by the sense amplifier block 143.

In the semiconductor memory device according to the present invention, the overdriving operation is controlled by the overdriving control block 120 described in FIG. 5. If the first control signal SAEN_PCG is activated, the overdriving control block 120 generates the control pulse SPB and outputs the control pulse SPB to the power supplier 130. Referring to FIG. 8, the control pulse SPB is activated twice A and B, i.e., during a first activation period Td1 and a second activation period Td2. Herein, the first and second activation periods Td1 and Td2 are respectively made by the first and second pulse generators 122 and 124 included in the overdriving control block 120.

Then, if the control pulse SPB being a logic low level is inputted to the power supplier 130, i.e., during the first activation period Td1 and the second activation period Td2, the power supplier 130 outputs the high voltage VPP to the sense amplifier driving block 142 included in the sense amplifying block 140. Otherwise, the power supplier 130 outputs the core voltage Vcore to the sense amplifier driving block 142.

When the control pulse SPB is activated, i.e., Td1, the high voltage VPP is inputted as the operation voltage to the sense amplifier driving block 142; and, as a result, an operation speed of the sense amplifier block 143 becomes fast. Namely, the sense amplifying block 140 including the sense amplifier block 143 performs the overdriving operation.

In addition, the second activation period Td2 is for reducing the write recovery time tWR. That is, the operation voltage is boosted up from a voltage level of the core voltage Vcore to a voltage level of the high voltage VPP before a word line is disabled, i.e., the semiconductor memory device carries out a precharge operation in response to the precharge command signal PCG.

Therefore, if the operation voltage is boosted up to the high voltage VPP during a predetermined time before the sense amplifier performs the precharge operation, the write recover time tWR can be reduced. Herein, the write recover time tWR means a period until a precharge operation is carried out after a data is inputted and stored in response to a write command.

In detail, when a data stored in a unit cell corresponding with the write command and an inputted address is sensed and amplified, the data latched in the sense amplifier is eliminated and an inputted data from an external circuit is latched in the sense amplifier if an inputted data corresponded with the write command is not matched with the data latched in the sense amplifier. A time for performing above operation is the write recovery time tWR.

Thus, in the present invention, as the sense amplifier is operated under the high voltage VPP before the precharge operation without increasing the voltage level of the core voltage Vcore, the write recovery time tWR is reduced.

In addition, as a result, the semiconductor memory device has a sufficient time for a refresh operation. Generally, a data stored in an original unit cell is destroyed after the data is sensed and amplified. Herein, a data restoration is for recovering a destroyed data. Namely, if the data restoration is carried out under the high voltage, more charge can be stored in the original unit cell and a period for a refresh operation can be increased.

Figure 9:
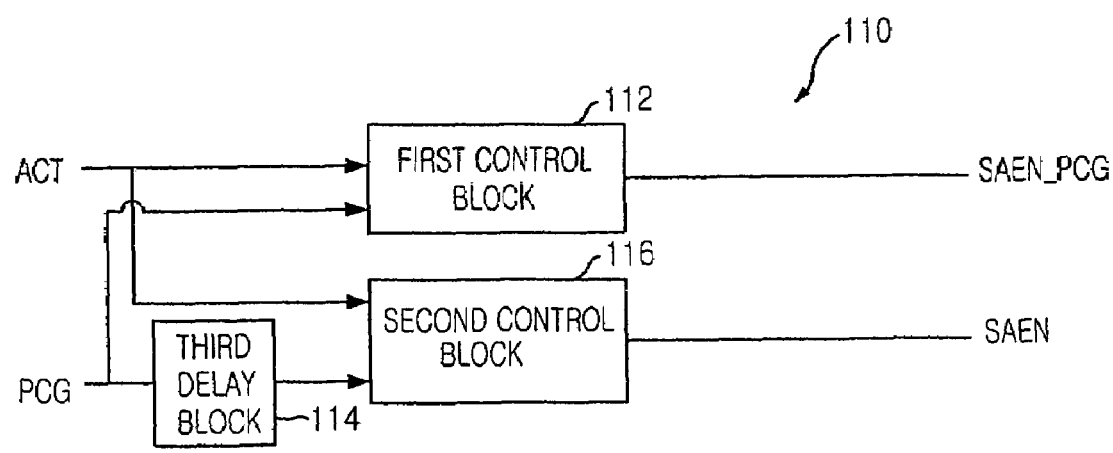
FIG. 9 is a block diagram depicting a command control block shown in FIG. 5.

FIG. 9 is a block diagram depicting the command control block 110 shown in FIG. 5.

As shown, the command control block 110 includes first and second control blocks 112 and 116 and a third delay block 114. The third delay block 114 delays the precharge command signal PCG. The third control block 112 is for receiving the activation control signal ACT and the precharge command signal PCG to thereby generate the first control signal SAEN_PCG. Likewise, the second control block 116 is for receiving the activation control signal ACT and a delayed precharge command signal outputted from the third delay block 114 to thereby generate the second control signal SAEN.

Figure 1:
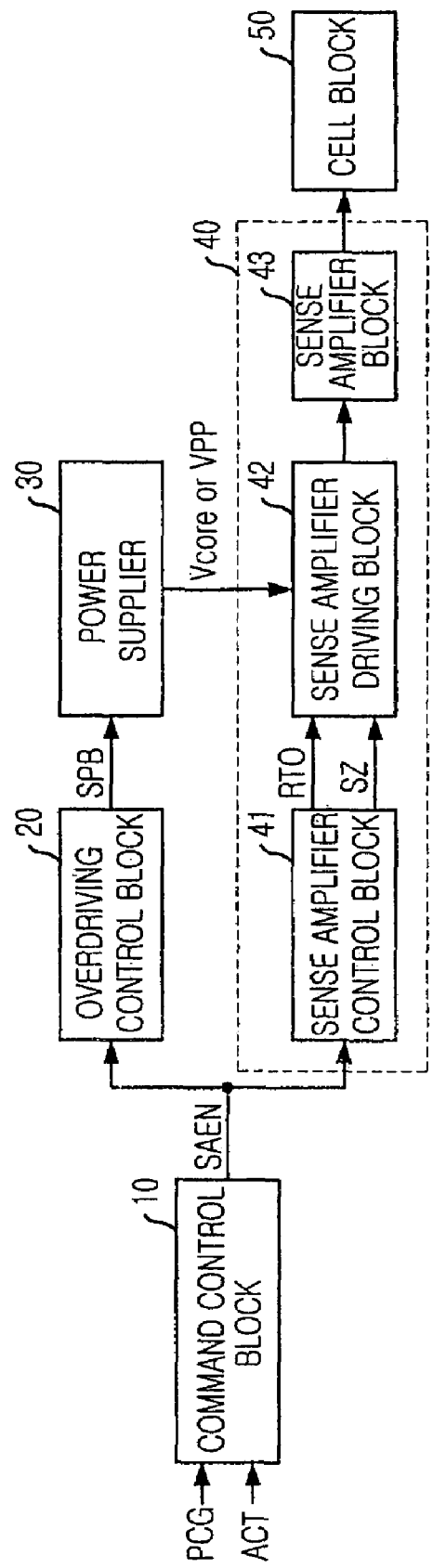
FIG. 1 is a block diagram describing partial blocks of a conventional semiconductor memory device related to a data write operation.
Figure 2:
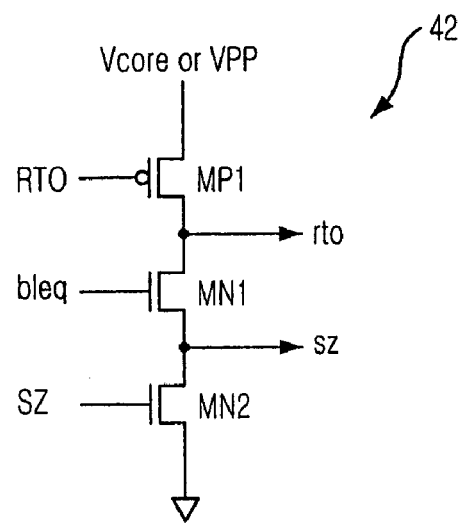
FIG. 2 is a circuit diagram showing a sense amplifier driving block shown in FIG. 1.
Figure 3:
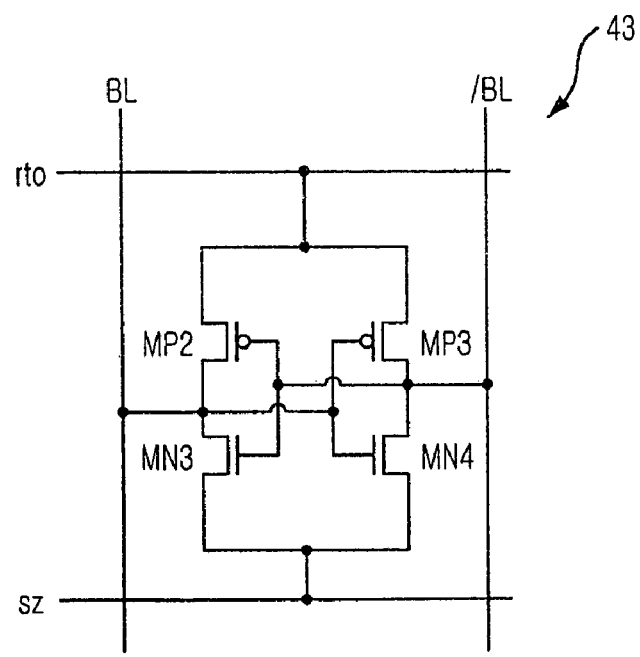
FIG. 3 is a circuit diagram describing a partial circuit of a sense amplifier block shown in FIG. 1.
Figure 4:
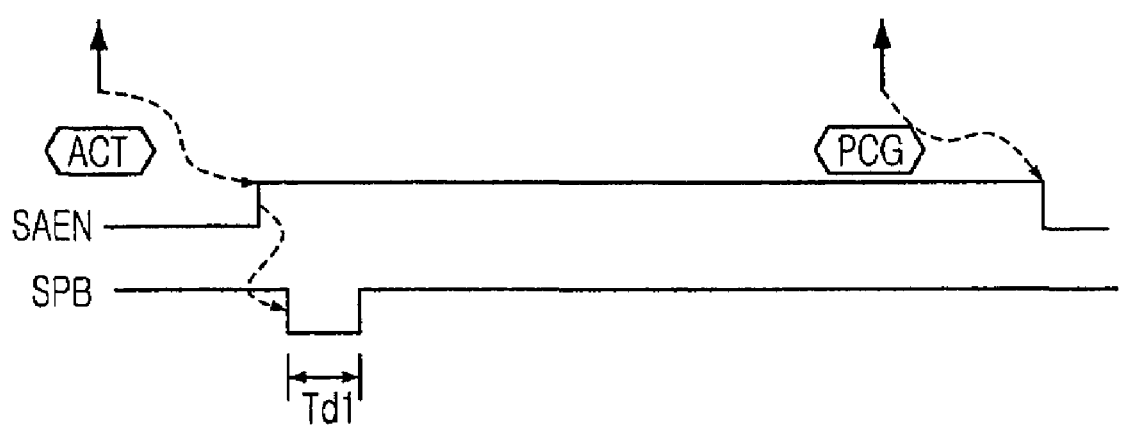
FIG. 4 is a waveform demonstrating an operation of the conventional semiconductor memory device shown in FIG. 1.

Herein, each of the first and second control blocks 112 and 116 is very similar to the command control block 10 shown in FIG. 1 in their structures and functions. Thus, a detailed description about internal structures of the first and second control blocks 112 and 116 is omitted herein. Also, except for an embodiment of the command control block 110 described in FIG. 9, the first and second control signals SAEN_PCG and SAEN described in FIG. 8 can be generated in various ways.

In a semiconductor memory device according to the present invention, it is unnecessary to use a high voltage of which voltage level is higher than that of the supply voltage during a precharge operation. That is, without the high voltage under the precharge operation, a write recovery time can be reduced. Also, the semiconductor memory device according to the present invention has a sufficient time for a refresh operation because a data restoration is carried out by using a high voltage.

The present application contains subject matter related to Korean patent application No. 2003-76852, filed in the Korean Patent Office on Oct. 31, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device for reducing a data recovery time, comprising:
    a cell block having a plurality of unit cells, each for storing a data;
    a command control block for receiving an activation control signal and a precharge command signal to thereby generate first and second control signals;

an overdriving control block for generating a control pulse in response to the first control signal;

a power supplier for selectively supplying one of a core voltage and a high voltage in response to the control pulse; and a sense amplifying block, which is enabled by the second control signal, for sensing and amplifying the data stored in the cell block by using one of the core voltage and the high voltage outputted from the power supplier, wherein an activation period of the second control signal is longer than that of the first control signal.

2. The semiconductor memory device as recited in claim 1, wherein the sense amplifying block includes:

a sense amplifier control block, which is enabled by the second control signal, for generating an operation voltage control signal and a ground control signal;

a sense amplifier driving block for receiving one of the core voltage or the high voltage and outputting one of the core voltage or the high voltage as an operation voltage and a ground as an ground level voltage in response to the operation voltage control signal and the ground control signal; and a sense amplifier block for sensing and amplifying the data stored in the cell block by using the operation voltage and the ground level voltage outputted from the sense amplifier driving block.

3. The semiconductor memory device as recited in claim 1, wherein the command control block includes:

a first control block for receiving the activation control signal and the precharge command signal to thereby generate the first control signal;

a first delay block for delaying the precharge command signal; and a second control block for receiving the activation control signal and a delayed precharge command signal outputted from the first delay block to thereby generate the second control signal.

4. The semiconductor memory device as recited in claim 3, wherein the overdriving control block includes:

a first pulse generator for receiving the first control signal to generate a first pulse signal;

a second pulse generator for receiving the first control signal to generate a second pulse signal; and a NOR gate for receiving the first and second pulse signals and outputting a result of a logic NOR operation as the control pulse.

5. The semiconductor memory device as recited in claim 4, wherein the first pulse generator includes:

a first inverter for inverting the first control signal;

a second inverter for inverting an output signal of the first inverter;

a second delay block for delaying an output signal of the second inverter by a predetermined time;

a third inverter for inverting an output signal of the second delay block; and a first NAND gate for receiving the output signal of the second inverter and an output signal of the third inverter and outputting a result of a logic NAND operation as the first pulse signal.

6. The semiconductor memory device as recited in claim 5, wherein the second pulse generator includes:

a fourth inverter for inverting the first control signal;

a third delay block for delaying an output signal of the fourth inverter by a predetermined time;

a fifth inverter for an output signal of the third delay block; and a second NAND gate for receiving the output signal of the fourth inverter and an output signal of the fifth inverter and outputting a result of a logic NAND operation as the second pulse signal.

7. The semiconductor memory device as recited in claim 4, wherein the power supplier includes:

a first inverter for inverting the control pulse;

a second inverter for inverting an output signal of the first inverter;

a first MOS transistor for outputting the high voltage in response to an output signal of the second inverter;

a comparator for comparing one of the core voltage and the high voltage with a reference voltage and outputting a comparison result;

a first NAND gate for receiving the comparison result outputted from the comparator and the control pulse and outputting a result of a logic NAND operation;

a third inverter for inverting the result outputted from the first NAND gate; and a second MOS transistor for outputting the core voltage in response to an output signal of the third inverter.

* * * * *